United States Patent
Moto et al.

[11] Patent Number: 6,163,648
[45] Date of Patent: Dec. 19, 2000

[54] HEATING DEVICE OF THE LIGHT IRRADIATION TYPE AND HOLDING DEVICE THEREFOR

[75] Inventors: Atsushi Moto, Yokohama; Shinji Suzuki, Kawasaki, both of Japan

[73] Assignee: Ushiodenki Kabushiki Kaisha, Tokyo, Japan

[21] Appl. No.: 09/370,216

[22] Filed: Aug. 9, 1999

[30] Foreign Application Priority Data

Aug. 7, 1998 [JP] Japan ................................. 10-234865

[51] Int. Cl.⁷ ........................................................ F26B 3/30
[52] U.S. Cl. ........................... 392/418; 118/500; 118/728; 219/390
[58] Field of Search ..................................... 219/390, 392, 219/405, 411; 392/416, 418; 118/724, 725, 728, 50.1, 500; 414/935–941

[56] References Cited

U.S. PATENT DOCUMENTS

| 4,535,227 | 8/1985 | Shimizu | 219/411 |
| 5,527,393 | 6/1996 | Sato et al. | 118/725 |
| 5,534,072 | 7/1996 | Mizuno et al. | 118/728 |

FOREIGN PATENT DOCUMENTS 9-22879  1/1997  Japan.

*Primary Examiner*—Teresa Walberg
*Assistant Examiner*—Shawntina L. Fuqua
*Attorney, Agent, or Firm*—Nixon Peabody LLP; David S. Safran

[57] ABSTRACT

A heating device of the light irradiation type and a holding device which can be used for it, in which it is possible to easily effect control to make the temperature of the semiconductor wafer uniform without distortion of the guard ring occurring, even if the same heating device is used for heating semiconductor wafers of different sizes is achieved by the fact that a substrate which is subjected to heat treatment by light irradiation is fixed by not only by a guard ring but also by a concentrically disposed annular auxiliary ring with a heat capacity per unit of area which is equal to the heat capacity of the guard ring. Furthermore, several guard rings can be concentrically arranged with the outermost guard ring being fixed by a guard ring support frame.

11 Claims, 3 Drawing Sheets

HEATING DEVICE OF THE LIGHT IRRADIATION TYPE AND HOLDING DEVICE THEREFOR

BACKGROUND OF THE INVENTION

1. Field of the Invention

The invention relates to a heating device of the light irradiation type, in which a round blank-like substrate fixed by a guard ring, such as a semiconductor wafer or the like, is quickly heated and thus treated, and a holding device for the substrate.

2. Description of Related Art

A round blank-like substrate, such as a semiconductor wafer, is subjected to heat treatment for layer formation, diffusion, baking and the like which comprises rapid heating, holding at a high temperature, and rapid cooling. Using a heating device of the light irradiation type, a temperature increase to at least 1000° C. can be achieved in a few seconds and rapid cooling obtained by stopping the light irradiation.

The temperature in the peripheral area of the semiconductor wafer as a result of heat irradiation from the outer circumferential surface of the semiconductor wafer or for similar reason is lower than in its middle area, even if the semiconductor wafer surface is uniformly irradiated with light. In the case, for example, in which the temperature of the middle area of the semiconductor wafer is 1100° C., the temperature in the peripheral area is about 30° C. lower than in the middle area. In this way, if the middle area and the peripheral area of the semiconductor wafer have a temperature difference, and thus the temperature distribution becomes nonuniform, there are cases in which a dislocation error occurs which is called slip, and in which scrap is produced.

To prevent formation of slip in the semiconductor wafer, a guard ring is used as the measure to prevent formation of the temperature difference between the middle area and the peripheral area of the semiconductor wafer during its heat treatment by rapid heating, holding at a high temperature, and rapid cooling. This guard ring is an annular body which is made of a thin plate of a metal with a high melting point, such as molybdenum, tungsten or tantalum, or of a ceramic, such as silicon carbide or the like. In the inner circumferential area of its circular opening, a semiconductor wafer bearing part is formed which is a drilled-out opening of the annular guard ring.

The peripheral area of the guard ring is supported by a guard ring support frame which is located over the entire periphery of the base plate of the heating device. The semiconductor wafer is arranged such that it is installed in the circular opening of the guard ring. The bearing part of the guard ring holds the semiconductor wafer. Due to the light irradiation, the guard ring itself reaches a high temperature and also heats the opposite outer circumferential surface of the semiconductor wafer by heat radiation, compensating for the heat radiation from the outer circumferential surface of the semiconductor wafer. In this way, the temperature difference between the middle area and the peripheral area of the semiconductor wafer is reduced, the temperature distribution is made essentially uniform, and the formation of slip is prevented.

As was described above, in its circular opening, the annular guard ring which is supported by the guard ring support frame fixes the semiconductor wafer peripherally in its circular opening. The guard ring itself, due to light irradiation, reaches a high temperature. In this way, the heat radiation from the outer circumferential surface of the semiconductor wafer is compensated. To achieve suitable compensation (neither too much nor too little) and to eliminate the temperature difference between the middle area and the peripheral area of the semiconductor wafer, a state is desired in which the guard ring is near the semiconductor wafer and can act more or less as the outer edge area of the semiconductor wafer. This means that it is preferred that the height of the inner circumferential surface of the circular opening of the guard ring is equal to the height of the outer circumferential surface of the opposite semiconductor wafer, the thickness of the inner circumferential surface of the circular opening of the guard ring is likewise equal to the thickness of the semiconductor wafer and also the heat capacity per unit of area is as great as the heat capacity of the semiconductor wafer per unit of area. When one such guard ring is used, during light irradiation, a temperature change of the guard ring exactly following the temperature change of the semiconductor wafer can be achieved. Therefore, the heat radiation from the outer circumferential surface of the semiconductor wafer can be exactly compensated and a uniform temperature distribution in the semiconductor wafer obtained. One such guard ring is disclosed for example in the Japanese patent disclosure document HEI 9-22879.

Conventionally, the outside diameter of a semiconductor wafer has been for the most part 200 mm (8 inches). But recently, it has been becoming larger and larger, and is gradually approaching 300 mm (12 inches). Furthermore, there are cases in which a semiconductor wafer with a diameter of less than 200 mm is used. Therefore, for a heating device of the light irradiation type, a device is also desired which can be used for heating of semiconductor wafers with different outside diameters.

It is necessary that the guard ring support frame, in any case, be so large that it can support a guard ring for the largest semiconductor wafer when several different semiconductor wafers with different outside diameters are to be processed in the same device.

The inscribed circle of the guard ring support frame must therefore be as large as the outside diameter of the guard ring for the largest semiconductor wafer. It is therefore necessary that the outside diameter of a guard ring for a semiconductor wafer with a small outside diameter be made as large as the outside diameter of a guard ring for the largest semiconductor wafer. In this way, the width of an annular guard ring (difference between the outside radius and the inside radius of the guard ring) becomes greater. A guard ring with a width of about 80 mm is needed for a semiconductor wafer with a diameter of 200 mm so that a semiconductor wafer with a diameter of 200 mm can also be supported by a guard ring support frame which supports a guard ring for a semiconductor wafer, for example, with a diameter of 300 mm.

The outer circumferential surface of the guard ring is in contact with the guard ring support frame. However, since the guard ring and the guard ring support frame have different shapes, even if they are produced from the same material, the heat capacity per unit of area is different, the heat capacity of the guard ring support frame being greater. The heat of the guard ring is therefore transported via the contacting surfaces to the guard ring support frame. Furthermore, heat is radiated from the outer circumferential surface of the guard ring. The temperature of the outer circumferential surface of the guard ring therefore becomes lower even if light is radiated such that the semiconductor wafer and the guard ring have the same temperature. In this way, the temperature distribution becomes nonuniform. The heat in the area of the guard ring in the vicinity of the semiconductor wafer is transported to the outer circumferential surface; this influences the relation between the heat radiation and the compensation which take place between the semiconductor wafer and the guard ring.

When the output of a heating lamp is controlled to make the temperature of the semiconductor wafer uniform, therefore the temperature distribution in the guard ring must be considered, making control difficult.

When the width of the guard ring is large, high thermal stress occurs in the guard ring as a result of the temperature difference between the area in the vicinity of the semiconductor wafer and the outer circumferential surface. There are therefore cases in which distortion of the guard ring, or in extreme case fracture of the guard ring, occurs.

SUMMARY OF THE INVENTION

Therefore, a primary object of the present invention is to devise a heating device of the light irradiation type and a holding device which can be used in the heating device, in which it is possible to easily effect control for making the temperature of the semiconductor wafer uniform without distortion of the guard ring occurring, even if the same heating device is used for heating semiconductor wafers of different sizes.

By the invention, in a holding device for a round substrate which is to be heat treated by light irradiation, the holding device itself reaching a high temperature due to the light irradiation, the noted object is achieved by the holding device comprising a guard ring and an auxiliary ring, in which the guard ring has:

- a circular area which is opposite and surrounds the substrate circumferential surface and which has essentially the same height as the substrate thickness;
- an annular main part which is connected to the outside of the above described area which is opposite the circumferential surface of the substrate, and which furthermore has essentially the same thickness as the substrate, and with a heat capacity per unit of area which is essentially equal to the heat capacity of the substrate; and
- an annular substrate bearing part with a surface which runs from the lower end of the area which is opposite the circumferential surface of the substrate in the direction to the middle of the ring has a tapered shape;

and wherein:

- the auxiliary ring has an inside diameter which is greater than the inside diameter of the guard ring,
- the auxiliary ring has a heat capacity per unit of area which is essentially equal to the heat capacity of the main part of the guard ring, and
- the outer circumferential surface area of the main part of the guard ring rests on the inner circumferential surface area of the auxiliary ring.

In particular, the auxiliary ring, on the one hand, can be made as an essentially plane ring, or on the other hand, the auxiliary ring can correspond in its shape essentially to the guard ring, except that the inside diameter of the auxiliary ring is greater than the inside diameter of the guard ring and the outside diameter is greater than the outside diameter of the guard ring.

It is likewise possible to use several auxiliary rings and/or several guard rings per holding device and to place them concentrically in or one top of one another. In this way, it is possible with special ease to refit the holding device to hold substrates of different sizes. For example, to hold a substrate with a smaller outside diameter only one more guard ring (or optionally also several guard rings) with a narrower inside and outside diameter need be seated on the smallest guard ring of the holding device which had be used in the past.

The invention furthermore relates to heating devices which encompass the holding device in accordance with the invention.

In the following, the invention is specifically described using several embodiments shown in the drawings.

DETAILED DESCRIPTION OF THE INVENTION

Figure 1:
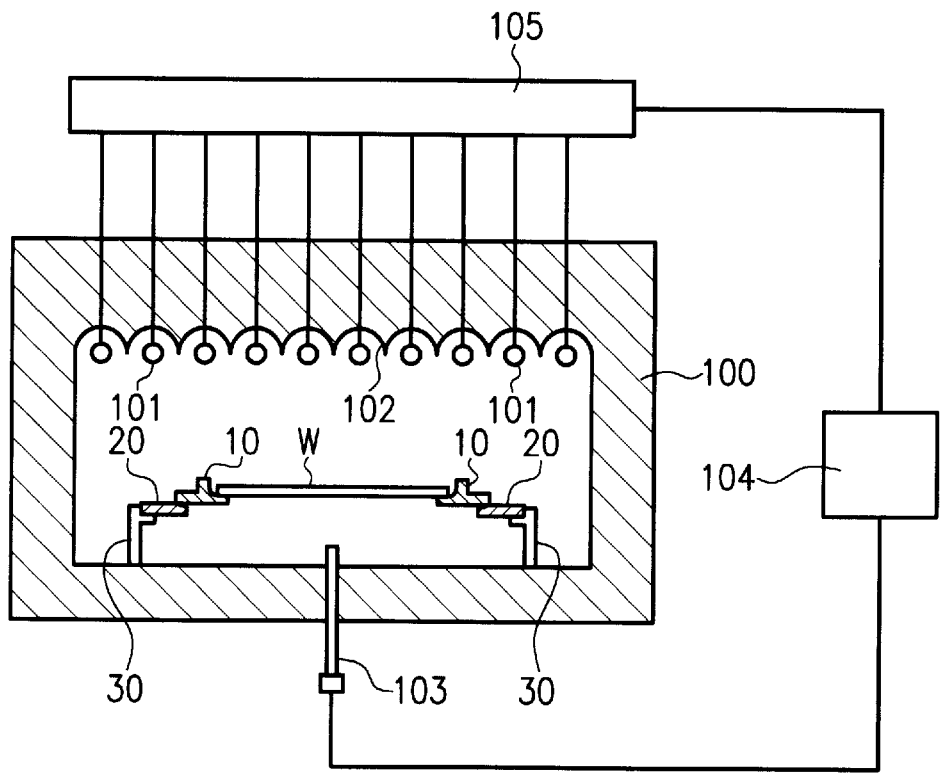
FIG. 1 is a schematic cross section of an arrangement of a heating device of the light irradiation type.

FIG. 1 schematically shows the arrangement of one example of a heating device of the light irradiation type in which a semiconductor wafer which is fixed by a guard ring is rapidly heated and treated. On the top side of the interior of an oven 100, there is a circular light source in which there are several annular halogen lamps 101 arranged concentrically.

Behind the halogen lamps 101 are provided trough-like mirrors 102 with a concave cross-sectional shape. The light emitted from the lamps 101 is emitted downward with high efficiency. The bottom of the interior of the oven 100 is provided with a guard ring support frame 30 which can heat a semiconductor wafer with an outside diameter of 300 mm. When a semiconductor wafer with an outside diameter less than 300 mm is heated, a guard ring 10 is supported by an auxiliary ring 20 which is, in turn, supported by a guard ring support frame 30.

The guard ring 10 fixes a round semiconductor wafer W with an outside diameter of, for example, 200 mm and a thickness of 0.8 mm in a horizontal position. Therefore, the light emitted by the lamps 101 irradiates the semiconductor wafer W, the guard ring 10 and the auxiliary ring 20. The guard ring support frame 30 is turned by means of a turntable (not shown), so that the semiconductor wafer W is uniformly heated.

Furthermore, if necessary, between the lamps 101 and the semiconductor wafer W, there can be a fused silica glass window to make the atmosphere in the vicinity of the semiconductor wafer W and the atmosphere in the vicinities of the lamps 101 different. FIG. 1 shows neither the inlet opening nor the outlet opening used for transporting the semiconductor wafer W into the oven 100 and for removing the semiconductor wafer W from the oven 100.

On the bottom of the semiconductor wafer W, there is a radiation thermometer 103 of the noncontact type by which the temperature of the semiconductor wafer W is determined. Furthermore, a temperature control element 104 controls the output of a lamp power source 105 based on temperature determined by the radiation thermometer 103, such that the semiconductor wafer W is heat treated at a preset rate of temperature increase, held a predetermined holding temperature for a stipulated holding time, and then cooled a predetermined rate of temperature decrease.

Figure 2:
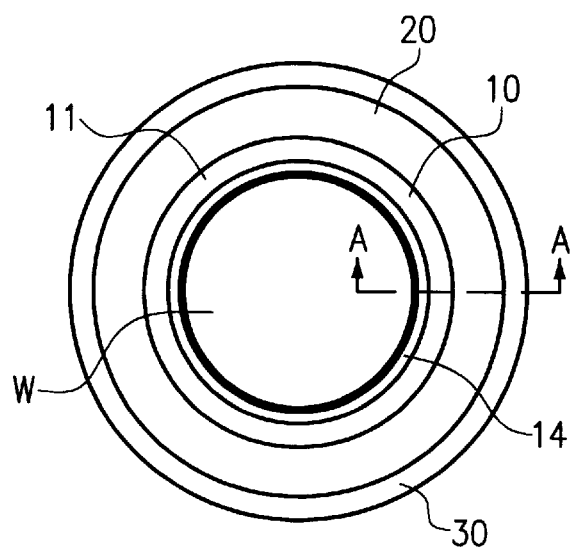
FIG. 2 is a plan view illustrating the positional relationships between a guard ring, a semiconductor wafer, an auxiliary ring and a guard ring support frame.
Figure 3:
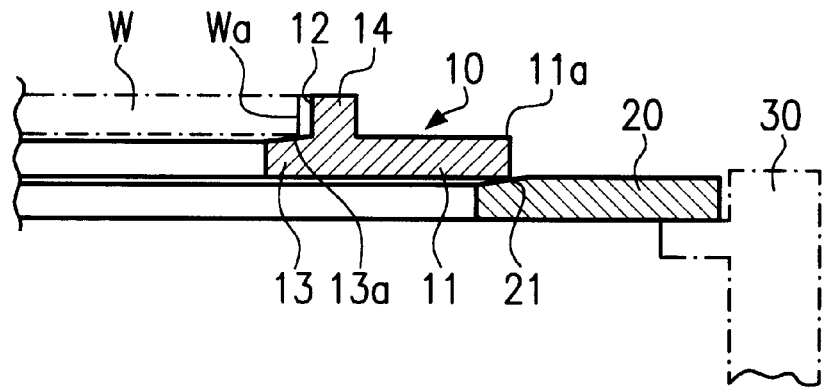
FIG. 3 is a schematic longitudinal cross section of one embodiment of the invention which has been taken along line A—A in FIG. 2.

FIGS. 2 & 3 show an embodiment of the invention in which the semiconductor wafer W is fixed in a circular, opening of the guard ring 10. The guard ring 10 is sized for a semiconductor wafer W with an outside diameter of 200 mm, for example, and is an annular body with an outside diameter of 300 mm and an inside diameter of 196 mm. The guard ring 10 is supported by the auxiliary ring 20 which is, in turn, supported by the guard ring support frame 30. The auxiliary ring 20 is an annular body with a thickness of 0.8 mm, an outside diameter of 360 mm and an inside diameter of 296 mm. In this way, the guard ring support frame 30 can heat a semiconductor wafer with an outside diameter of 300 mm, the outside diameter of the guard ring 10 being small, i.e. the width (difference between the outside diameter and the inside diameter of the guard ring 10) is small. The guard ring 10 and the auxiliary ring 20 are formed from silicon carbide. Its thermal properties, such as the coefficient of thermal expansion, the specific heat and the like, are very similar to the thermal properties of the silicon semiconductor wafer W.

The guard ring 10 has an annular main part 11 with an end supported by the auxiliary ring 20. The thickness of the main part 11 is 0.8 mm and is equal to the thickness of the semiconductor wafer W. The heat capacity of the main part 11 per unit of area is therefore essentially equal to the heat capacity of the semiconductor wafer W per unit of area. Therefore, it can function as a nearby semiconductor wafer. Such a guard ring, per se, is disclosed in commonly assigned co-pending U.S. patent application Ser. No. 09/370,217 filed on even date herewith and claiming priority of Japanese Patent Application No. 10-234864. This co-pending application is hereby incorporated by reference and the guard ring 10 of this application can take any of the forms disclosed in said application, not only the specific form shown herein.

The heat capacity of the auxiliary ring 20 is essentially equal to the heat capacity of the guard ring 10 per unit of area. The outer circumferential surface area 11a of the main part 11 of the guard ring 10 is seated on the inner circumferential surface 21 of the auxiliary ring 20. Here, it is preferred that the inner circumferential surface area 21 of the auxiliary ring 20 is tapers, and that the outer circumferential surface area 11a of the main part 11 is in linear contact with the inner circumferential surface area 21 of the auxiliary ring 20. In this way, the contact surface between the guard ring 10 and the auxiliary ring 20 is small, and heat transport as a result of heat conduction between the guard ring 10 and the auxiliary ring 20 is reduced.

On the inside of the main part 11, an annular projection 14 is formed with an inner circumferential surface which faces the outer circumferential surface Wa of the semiconductor wafer W at a distance of roughly 1 mm when the semiconductor wafer W is fixed. Thus a surface area 12 is formed which is essentially parallel to (coaxial with) the circular outer periphery of the semiconductor wafer W and which faces the circumferential surface of the substrate. The height of the area 12 is 0.8 mm, and therefore, it is identical to the thickness of the semiconductor wafer W. The outer circumferential surface Wa of the semiconductor wafer W and the area 12 are therefore essentially exactly opposite one another in the vertical direction when the semiconductor wafer W is fixed.

From the lower end of the area 12, a substrate bearing part 13 on which the semiconductor wafer W is seated is formed that is directed toward the middle. The surface 13a of the substrate bearing part 13 has a shape which is downwardly inclined in the direction toward the middle at an angle of inclination of, for example, roughly 5°. When the semiconductor wafer W is seated on the substrate bearing part 13, the semiconductor wafer W is therefore supported in linear contact with the surface 13a of the substrate bearing part 13. This means that the contact surface is extremely small and heat transport as a result of heat conduction between the semiconductor wafer W and the guard ring 10 is small. Heat conduction therefore has no effect on heat transport, even if the thickness of the substrate bearing part 13 is increased. This means that the thickness of the substrate bearing part 13 can be increased because, even when its thickness is increased, the disadvantage of heat transport as a result of heat conduction does not arise. Therefore, the substrate bearing part 13 can be easily produced.

Figure 4:
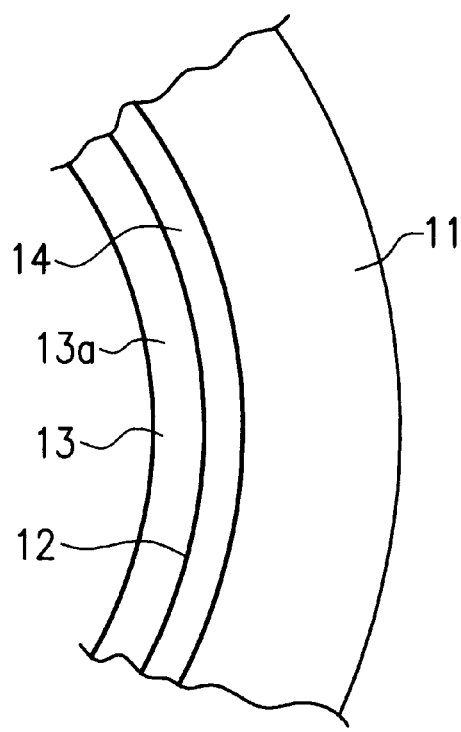
FIG. 4 is a partial plan view of a guard ring.

The substrate bearing part 13 has a width of roughly 2 mm and is made annular, as is shown in FIG. 4. If the semiconductor wafer W is seated on the substrate bearing part 13, the clearance between the outer circumferential surface Wa of the semiconductor wafer W and the area 12 is shielded by the substrate bearing part 13. Therefore, light emitted from above this clearance is prevented from reaching through it to the below the semiconductor wafer W.

When the temperature is measured by a radiation thermometer 103 of the noncontact type which is located below the semiconductor wafer W, therefore no errors occur. Thus, the temperature can be exactly measured.

When the semiconductor wafer W is seated and supported on the substrate bearing part 13 of the guard ring 10, and when the lamps 101 of the heating device of the light irradiation type are operated, the temperature of the semiconductor wafer W, the guard ring 10, and the auxiliary ring 20 increases quickly. The heat of the auxiliary ring 20 which is in contact with the guard ring support frame 30 is thus transported via its contact surface by heat conduction to the guard ring support frame 30 and is emitted from the outer circumferential surface of the auxiliary ring 20. The outer peripheral area and the inner peripheral area of the auxiliary ring 20 have temperature differences and the temperature distribution becomes nonuniform. However, because the contact surface between the guard ring 10 and the auxiliary ring 20 is small, the guard ring 10 is hardly influenced by the auxiliary ring 20 which has a nonuniform temperature distribution. The uniformity of the temperature distribution is very good. Prediction of the temperature distribution and control of the power of the heating lamp for making the temperature of the semiconductor wafer W uniform therefore become simple.

Thermal stress arises due to the nonuniform temperature distribution of the auxiliary ring 20. Conventionally a wide guard ring was used here. However, by division of such a wide guard ring into the narrow guard ring 10 and narrow auxiliary ring 20, a deviation occurs in the contact area between the two. The thermal stress of the auxiliary ring 20 is therefore not transferred to the guard ring 10. Also, the thermal stress of the auxiliary ring 20 is therefore reduced by this deviation. Therefore, no distortion due to thermal stress occurs in the guard ring 10 and the auxiliary ring 20.

Heat is also radiated from the outer circumferential surface Wa of the semiconductor wafer W. In doing so, the main part 11 of the guard ring 10 has the same thickness as that of the semiconductor wafer W. Also, the heat capacity per unit of area is roughly identical to the heat capacity of the semiconductor wafer W per unit of area. The guard ring 10 can therefore act as a nearby semiconductor wafer W. The temperature of the guard ring 10 therefore exactly follows the temperature change of the semiconductor wafer W. Furthermore, the outer circumferential surface Wa of the semiconductor wafer W and the area 12 of the guard ring 10 are essentially exactly opposite one another in the vertical direction. The heat emitted from the outer circumferential surface Wa of the semiconductor wafer W is therefore exactly compensated by the heat emitted from the area 12 of the guard ring 10. The temperature distribution of the semiconductor wafer W therefore becomes uniform. Thus, formation of slip can be prevented.

Furthermore, the semiconductor wafer W is supported in a linear contact state on the surface 13a of the substrate bearing part 13, the contact surface being extremely small. The heat transport as a result of heat conduction between the semiconductor wafer W and the guard ring 10 is thus low. Therefore, with respect to the heat transport between the two, only heat transport by radiation need be considered. Prediction of the temperature distribution and control of making the temperature of the semiconductor wafer W uniform are therefore simple.

Figure 5:
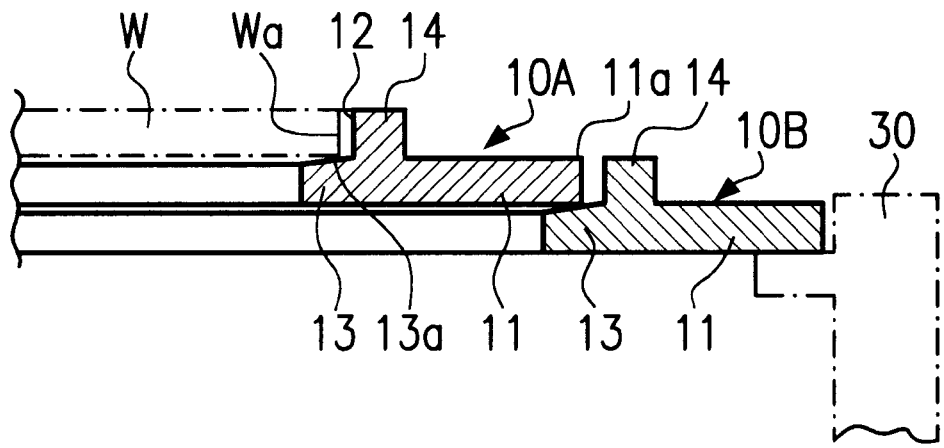
FIG. 5 a cross section corresponding to that of FIG. 3, but showing another embodiment of the invention.

FIG. 5 shows another embodiment of the invention. In this figure, a guard ring 10A is shown for a semiconductor wafer with a small outside diameter of, for example, 200 mm, and a guard ring 10B is shown for a semiconductor wafer with a large outside diameter of, for example, 300 mm. Only the guard ring 10B is used when a semiconductor wafer with a diameter of 300 mm is heated. When a semiconductor wafer with a diameter of 200 mm is heated, the outer circumferential surface area 11a of the main part 11 of the guard ring 10A is seated in the wafer bearing part 13 of the guard ring 10B without removing the guard ring 10B, as is shown in FIG. 5. This means that the guard ring 10A and the guard ring 10B are arranged concentrically and the semiconductor wafer W is fixed by the guard ring 10A and heat treated.

In this case, the guard ring 10B serves the function of the auxiliary ring 20 in the preceding embodiment. Prediction of the temperature distribution and control of the output of the heating lamp to make the temperature of the semiconductor wafer W uniform therefore become simple, and no distortion due to thermal stress occurs in the guard ring 10A and the guard ring 10B.

When a semiconductor wafer with an outside diameter of less than 200 mm is heat treated it is possible to place a guard ring which corresponds to the diameter of the semiconductor wafer W on top of the guard ring 10A on top of one another. Therefore at least three different guard rings can be used.

Figure 6:
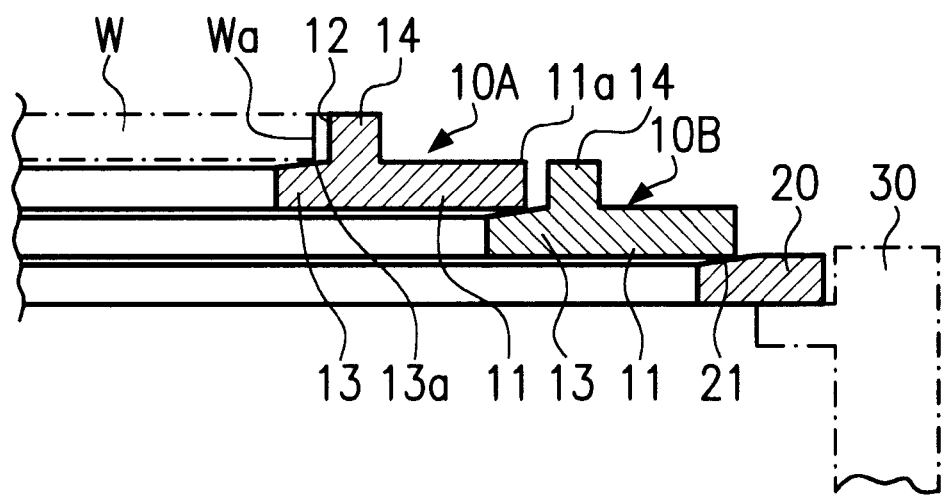
FIG. 6 shows a cross section showing an embodiment using auxiliary rings in accordance with both of the embodiments of FIGS. 3 & 5.

FIG. 6 shows a third embodiment of the invention in which there is an auxiliary ring 20 between the guard ring 10B for the semiconductor wafer W with a 300 mm diameter and the guard ring support frame 30. In the case of a semiconductor wafer W with a 200 mm diameter, the guard ring 10B and the auxiliary ring 20, therefore, have the same function as the auxiliary ring 20 in FIG. 3, and in the case of a semiconductor wafer W with a 300 mm diameter, the auxiliary ring 20 has the same function as the auxiliary ring 20 in FIG. 3. In this case as well, prediction of the temperature distribution and control of the output of the heating lamp to make the temperature of the semiconductor wafer uniform is simplified. Furthermore distortion due to thermal stress in the guard ring 10A, the guard ring 10B, and the auxiliary ring 20 is prevented.

Action of the invention

As was described above, in accordance with the invention, a conventionally used annular guard ring with a large width is divided into a guard ring with a small width and an auxiliary ring with a small width or into several different guard rings with a small width so that, when several different semiconductor wafers with different outside diameters are heat treated, the same device can be used. Control to make the temperature of the semiconductor wafer uniform is simplified. Thus a heating device of the light irradiation type can be obtained in which no distortion of the guard ring occurs.

We claim:

1. Holding device for a round blank-like substrate which is to be heat treated by light irradiation, the holding device itself reaching a high temperature due to the light irradiation, comprising a guard ring and an auxiliary ring, in which the guard ring has:

an annular surface area which faces and surrounds a circumferential surface of the substrate and which has a height which is essentially the same as a thickness of the substrate, an annular main part which is connected outwardly of said surface area and which has essentially the same thickness as the substrate, and with a heat capacity per unit of area which is essentially equal to the heat capacity of the substrate, and an annular substrate bearing part with a surface which runs from a lower end of the surface area in a direction toward a middle of the guard ring at a downward inclination;

and wherein the auxiliary ring has:

an inside diameter which is greater than the inside diameter of the guard ring, a heat capacity per unit of area which is essentially equal to the heat capacity of the main part of the guard ring; and wherein an outer circumferential surface area of the main part of the guard ring rests on the inner circumferential surface area of the auxiliary ring.

2. Holding device as claimed in claim 1, wherein the substrate bearing part of the guard ring and the annular main part are arranged essentially in one plane and the circular surface area is an inner peripheral surface of a projection which projects upwardly from the substrate bearing part and the main part.

3. Holding device as claimed in claim 1, wherein the auxiliary ring is an essentially planar ring.

4. Holding device as claimed in claim 3, wherein the inner circumferential surface area of the auxiliary ring on which the outer circumferential surface area of the main part of the guard ring is seated inclines downwardly.

5. Holding device as claimed in claim 1, wherein the auxiliary ring is made essentially like the guard ring, a circular surface area of the auxiliary ring facing the outer circumferential surface of the guard ring and having essentially the same height as the thickness of the main part of the guard ring, and an area of the auxiliary ring corresponding to the substrate bearing part of the guard ring being a support surface for the outer circumferential surface area of the guard ring.

6. Holding device as claimed in claim 5, wherein a plurality of auxiliary rings are arranged concentrically with respect to one another.

7. Holding device as claimed in claim 3, in which, concentric to the guard ring, there is at least one additional guard ring which is made like the guard ring intended to hold the substrate, the inside diameter of each guard ring being greater than the inside diameter of each inwardly adjacent guard ring, the outside diameter of each guard ring being greater than the outside diameter of each inwardly adjacent guard ring, the circular area of each guard ring facing the outer circumferential surface of the main part of each adjacent inner guard ring and having essentially the same height as the thickness of the main part of the inner adjacent guard ring.

8. Heating device of the light irradiation type for heat treatment of a round substrate which comprises at least one light source, a guard ring support frame, and a holding device for the substrate, wherein the holding device comprises a guard ring and an auxiliary ring, in which the guard ring has:

an annular surface area which faces and surrounds a circumferential surface of the substrate and which has a height which is essentially the same as a thickness of the substrate, an annular main part which is connected outwardly of said surface area and which has essentially the same thickness as the substrate, and with a heat capacity per unit of area which is essentially equal to the heat capacity of the substrate, and an annular substrate bearing part with a surface which runs from a lower end of the surface area in a direction toward a middle of the guard ring at a downward inclination;

and wherein the auxiliary ring has:

an inside diameter which is greater than the inside diameter of the guard ring, a heat capacity per unit of area which is essentially equal to the heat capacity of the main part of the guard ring; and wherein an outer circumferential surface area of the main part of the guard ring rests on the inner circumferential surface area of the auxiliary ring; and wherein the holding device is held by the guard ring support frame in a region of the outer circumferential surface area of the auxiliary ring.

9. Heating device of the light irradiation type according to claim 8, wherein the auxiliary ring is made essentially like the guard ring, a circular surface area of the auxiliary ring facing the outer circumferential surface of the guard ring and having essentially the same height as the thickness of the main part of the guard ring, and an area of the auxiliary ring corresponding to the substrate bearing part of the guard ring being a support surface for the outer circumferential surface area of the guard ring.

10. Heating device of the light irradiation type according to claim 8, wherein a plurality of auxiliary rings are arranged concentrically with respect to one another and the auxiliary ring by which the holding device is held by the guard ring support frame is an outermost auxiliary ring.

11. Heating device of the light irradiation type according to claim 8, wherein, concentric to the guard ring, the holding device has at least one additional guard ring which is made like the guard ring intended to hold the substrate, the inside diameter of each guard ring being greater than the inside diameter of each inwardly adjacent guard ring, the outside diameter of each guard ring being greater than the outside diameter of each inwardly adjacent guard ring, the circular area of each guard ring facing the outer circumferential surface of the main part of each adjacent inner guard ring and having essentially the same height as the thickness of the main part of the inner adjacent guard ring.

* * * * *